United States Patent [19]

Foch et al.

[11] Patent Number: 4,642,553
[45] Date of Patent: Feb. 10, 1987

[54] COMMUTATOR CONTAINING A SEMICONDUCTOR WITH UNIDIRECTIONAL CURRENT AND BIDIRECTIONAL VOLTAGE, AND WITH CONTROLLED INTERRUPTION AND AUTOMATIC IGNITION

[75] Inventors: Henri Foch, Toulouse; Jacques Duparc, Le Vaudoue, both of France

[73] Assignee: Jeumont-Schneider Corporation, France

[21] Appl. No.: 724,993

[22] Filed: Apr. 19, 1985

[30] Foreign Application Priority Data

Apr. 20, 1984 [FR] France ............................. 84 06286

[51] Int. Cl.⁴ .......................................... H03K 17/72
[52] U.S. Cl. .................................... 323/322; 323/211; 363/137; 307/252 C
[58] Field of Search ................................. 323/209–211, 323/239, 241, 322, 324; 307/252 C, 252 T, 252 UA; 363/53–54, 57–58, 136–138

[56] References Cited

U.S. PATENT DOCUMENTS

| | | | |
|---|---|---|---|
| 3,622,806 | 11/1971 | Williams | 307/252 C |
| 3,992,661 | 11/1976 | Kelley, Jr. | 323/210 |
| 4,356,440 | 10/1982 | Curtiss et al. | 323/210 |
| 4,449,088 | 5/1984 | Cutler et al. | 363/57 X |
| 4,518,867 | 5/1985 | Lamboley | 323/239 X |

FOREIGN PATENT DOCUMENTS 0035379 9/1981 European Pat. Off. .
2325881 11/1974 Fed. Rep. of Germany .
2499789 8/1982 France .

Primary Examiner—Peter S. Wong
Attorney, Agent, or Firm—Rines and Rines; Shapiro and Shapiro

[57] ABSTRACT

The present invention pertains to a commutator containing a semiconductor operable with unidirectional current and bidirectional voltage and with controlled interruption and automatic ignition, and in which a semiconductor device with controlled commutation is utilized. In accordance with the invention, the commutator includes a logic gate (61) having an input which, when the anode-to-cathode voltage of the semiconductor device (2) is below a specific positive voltage close to zero, receives a logic signal from an adapting circuit (4) connected to the semiconductor anode. The other input of the logic gate receives a control logic signal, and the output of the gate is connected to another adapting circuit (5) which converts the logic signal output by the logic gate into a suitable control signal which is transmitted to a the control terminal of the semiconductor device (2). In a preferred embodiment the logic gate (61) is a "NOR" gate and the semiconductor device (2) is a thyristor with controlled commutation, known as a G.T.O. thyristor.

8 Claims, 5 Drawing Figures

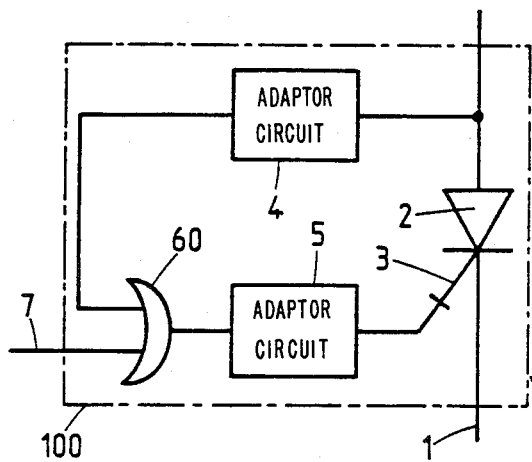
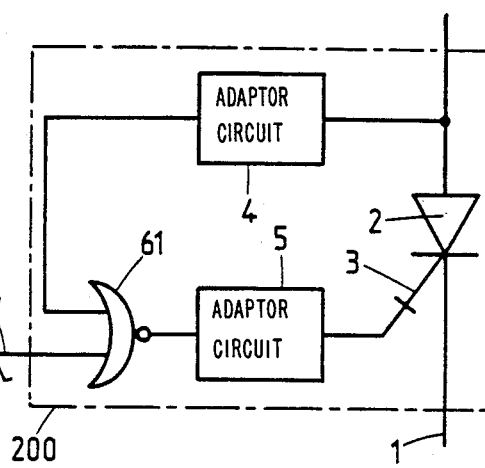
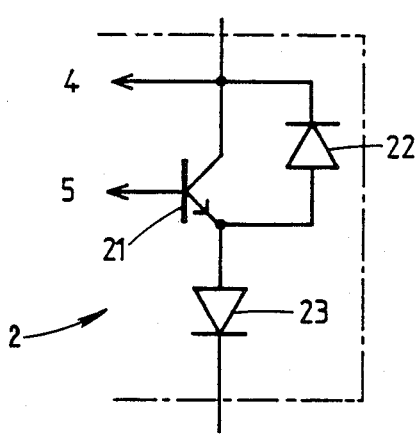
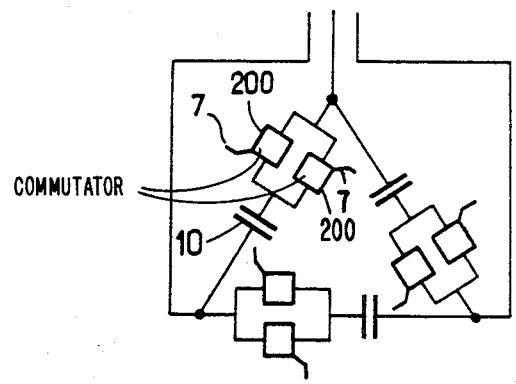
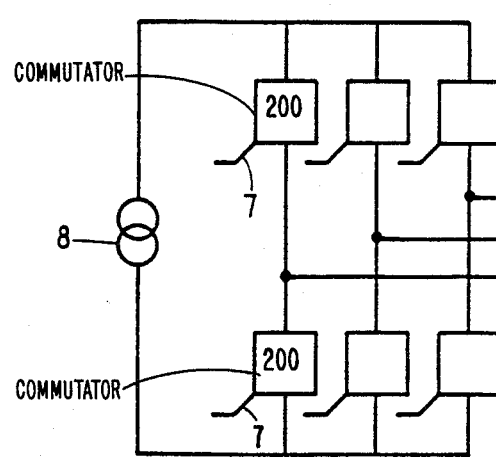

COMMUTATOR CONTAINING A SEMICONDUCTOR WITH UNIDIRECTIONAL CURRENT AND BIDIRECTIONAL VOLTAGE, AND WITH CONTROLLED INTERRUPTION AND AUTOMATIC IGNITION

The present invention pertains to electronics, namely to the domain known as power electronics, and the invention specifically pertains to a commutator containing a semiconductor with unidirectional current and bidirectional voltage and with controlled interruption and automatic ignition, wherein a semiconductor with controlled commutation is utilized.

Thyristors with controlled commutation are known as G.T.O. (gate-controlled switching) thyristors. Thyristors of this type are characterized by the fact that they are energized if the anode-to-cathode voltage and current are positive and if a positive impulse is transmitted to the trigger or gate. In turn, interruption occurs when the anode-to-cathode current becomes negative or attains a zero level, or when a negative impulse is transmitted to the trigger in the presence of a positive anode-to-cathode current. These thyristors offer multiple advantages. For certain applications, however, it is desirable to provide automatic triggering of the thyristor while retaining the characteristic advantage offered by the possibility of controlling de-energizing of the thyristor. Indeed, it is advantageous to eliminate any circuits which would facilitate commutation on triggering.

The object of the present invention is to provide a novel semiconductor commutator possessing both of the previously cited characteristics.

In summary, in accordance with the present invention, the semi-conductor commutator with unidirectional current and bidirectional voltage and with controlled interruption and automatic ignition includes a semiconductor with controlled commutation and a logic gate. A logic signal emitted by an adapting circuit connected to the semiconductor anode is transmitted to one input of the aforementioned logic gate when the anode-to-cathode voltage of the semiconductor is less than a specific positive voltage close to zero. In turn, a control signal may be transmitted to the other input of the previously cited logic gate. Another adapting circuit is connected to the output of said logic gate, in order to convert the logic signal emitted by this logic gate into a suitable control signal, which is transmitted to the semiconductor control terminal.

The aforementioned logic gate can be an "OR" gate, or, preferably, a "NOR" gate. The semiconductor may be a thyristor with controlled commutation, namely a G.T.O. thyristor, in which case the trigger constitutes the control terminal. The semiconductor may alternatively include a transistor whose base functions as a control terminal and whose collector functions as an anode. The collector is connected to the cathode of a diode, the anode of which is connected to the transistor emitter and to the anode of another diode, whose cathode functions as a semiconductor cathode.

It is possible for a commutation assembly of this type to be applied, for example, in direct or indirect converters of the following types: direct current-direct current, direct current-alternating current (notably Graetz bridges), and alternating current-direct current. It is also possible for the aforementioned commutator to be applied so as to provide a capacitive regulator capable of supplying variable reactive power.

It shall be possible to gain a fuller understanding of the present invention, as well as other purposes, advantages, and characteristics thereof, by reference to the description provided hereinafter, which shall be a non-restrictive description, and the accompanying drawings.

FIGS. 1 and 2 provide schematic representations of two embodiments of a commutator designed in accordance with the present invention, wherein the semiconductor shall comprise a thyristor.

FIG. 3 provides a partial diagram of an identical commutator wherein the semiconductor shall comprise a transistor and two diodes, in accordance with one specific aspect of the present invention.

FIG. 4 schematically represents a version of a capacitive regulator containing commutators designed in accordance with the present invention.

FIG. 5 schematically represents a converter of the Graetz bridge type for powering an asynchronous motor, with use of commutators designed in accordance with the present invention.

In reference to FIGS. 1 and 2, which represent two distinct embodiments of the present invention, the semiconductor may be a thyristor (2) with controlled commutation. The anode and the cathode of thyristor (2) are connected to a power supply circuit (1), for which the load and the source are not indicated within the drawings.

The anode-to-cathode voltage of the thyristor (2) is detected by an adapting circuit (4) which operates to provide a zero logic level when said voltage is below a specific positive level close to zero. This logic signal is transmitted to one input of a logic gate (60, 61), whose other input (7) is to be connected to the circuit intended to control interruption.

Another adapting circuit (5) operates to convert the logic signal emitted by the logic gate (60, 61) into an appropriate control signal, and this signal is transmitted to the trigger (3) of the previously cited thyristor (2).

The logic gate appearing in FIG. 1 is an "OR" gate, whereas the logic gate appearing in FIG. 2 is a "NOR" gate.

The commutation configuration represented by lines and dashes (100 within FIG. 1, 200 within FIG. 2) includes the elements just discussed.

In situations where it is preferable to employ a "NOR" logic gate of the type appearing within FIG. 2, the commutator operates in the manner now to be described in relation to FIG. 2, as an example.

When the anode-to-cathode voltage for the thyristor (2) attains a level below a specific positive level close to zero, the adapting circuit identified as (4) transmits a constant logic signal with a symbolic value of "0". This signal is transmitted to one of the inputs of the "NOR" gate (61). As a result, a signal with a symbolic value of "1" is transmitted to the other adapting circuit in the absence of an interrupting instruction that is, if a logic signal possessing a symbolic value of "0" is being transmitted to the other input of the "NOR" gate (61). In turn, the second adapting circuit (5) transmits an appropriate signal to the trigger (3) in order to initiate triggering of the tyristor (2). So long as the anode-to-cathode voltage is low and does not attain the specified level while the thyristor is energized, the first adapting circuit (4) transmits a logic signal which shall remain equivalent to a symbolic value of "0". Hence, any interrupting instruction received by the second input (7) of the previously cited "NOR" gate (61) in the form of a logic signal (an impulse, for example) will cause the status of the "NOR" gate output to change. As a result, the other adapting circuit will transmit an appropriate interrupting signal to the trigger of the thyristor (2), such as an impulse of 100 amperes in a situation where commutation of a current with an intensity of 600 amperes shall take place.

During interruption, the anode-to-cathode voltage increases, and the first adapting circuit (4) provides a logic signal with a symbolic value of "1," in order to ensure continuation of the interrupting instruction until the voltage diminishes to a level below a specific positive level. Then a change in the status of the aforementioned logic signal will cause the triggering instruction to be transmitted.

It is preferable for the first adapting circuit (4) to contain a comparator providing a certain level of hysteresis, so as to prevent random oscillation during changes in the status of the logic signal transmitted by this adapting circuit. The second adapting circuit (5) may comprise a flip-flop trigger which is series-connected to an appropriate amplifier.

FIG. 3 shows a modified commutator configuration in which a transistor and two diodes have been used in place of a thyristor. This configuration functions in the same manner as the previous embodiments, except in connection with the control signal, which is applied to the base of the transistor. In the case of a thyristor, it is possible for the control signal to consist of a positive or negative impulse according to the particular instruction which is to be executed. On the other hand, the signal must be represented by a constant voltage level or an absence of voltage in situations where a transistor is utilized.

In simple terms, the semiconductor (2) includes a transistor (21) whose base functions as a control terminal, whereas the collector functions as an anode and is connected to the cathode of a diode (22). Diode (22) has its anode connected to the transistor emitter and to the anode of another diode (23). The cathode of the latter diode constitutes the cathode of the semiconductor (2) as a whole.

The other diagrams, FIGS. 4 and 5, represent two categories of applications for a commutator designed in accordance with the present invention.

For example, FIG. 4 represents use of a commutation configuration embodying the present invention within a capacitive regulator for supplying reactive power within a power line.

It is possible, as shown in FIG. 4, to make use of a branch circuit containing two parallel top-to-bottom commutators (200) which are series-connected to a condenser (10). Each branch can be placed between one phase of the power supply line and an artificial floating neutral so as to provide a Y-connection (not shown in the diagram), or within a three-phase delta connection of the type appearing within FIG. 4. The latter type of connection offers the additional advantage of eliminating harmonics with triple multiplication.

This capacitive regulator permits supply of reactive power, whereas, in conventional static balancers where self-exciting regulators are used, reactive power must flow between a set of stationary condensers and the self-exciting regulator.

Finally, within FIG. 5, persons possessing sufficient technical knowledge shall recognize a converter of the Graetz bridge type, which contains commutators (200) where the input for the interrupting signal is identified by the reference numeral (7). A commutator of this type, for example, allows control of self-charging, as in the instance of an asynchronous motor (9) where there is a lagging power factor, by means of a conventional direct current source (8).

It is obvious that any modifications which may be introduced for similar purposes by technically knowledgeable persons would not be situated outside the context of the present invention. For example, several other types of logic gates, such as "NOT" and "AND" gates, can be used to provide an "OR" or "NOR" gate.

We claim:

1. A commutator operable with unidirectional current and bidirectional voltage and with controlled interruption and automatic ignition, comprising
   a unidirectional current semiconductor device of the controlled commutation type having terminals corresponding respectively to anode, cathode, and control,
   first adaptor circuit means having an input connected to the anode terminal of said semiconductor device and providing an output logic signal indicating when the anode-to-cathode voltage of said semiconductor device is less than a predetermined positive value close to zero,
   a logic gate having a first input connected to an output of said first adaptor circuit means to receive said logic signal, a second input which is a control signal input, and an output connected to an input of second adaptor circuit means which has an output connected to said control terminal of said semiconductor device,
   said logic gate outputting an interruption signal to said second adaptor circuit means when said first adaptor circuit means outputs said logic signal and an interruption instruction signal is received at said control signal input of said logic gate,
   said second adaptor circuit means providing a control signal to said control terminal of said semiconductor device to trigger said semiconductor device absent an interruption signal output from said logic gate and providing a control signal to said control terminal of said semiconductor device to interrupt said semiconductor device in response to an interruption signal output from said gate.

2. A commutator in accordance with claim 1, characterized by the fact that said logic gate is an "OR" gate.

3. A commutator in accordance with claim 1, characterized by the fact that said logic gate is a "NOR" gate.

4. A commutator in accordance with claim 1 characterized by the fact that said semiconductor device comprises a thyristor of the controlled commutation or G.T.O. type and wherein the trigger of said thyristor constitutes said control terminal.

5. A commutator in accordance with claim 1, characterized by the fact that said semiconductor device comprises a transistor whose base terminal constitutes said control terminal and whose collector terminal constitutes said anode terminal, said collector terminal being connected to the cathode of a diode whose anode is connected to the emitter of said transistor and to the anode of another diode whose cathode constitutes said cathode terminal of said semiconductor device.

6. A capacitive regulator comprising at least one branch circuit including a pair of commutators connected in parallel, top-to-bottom fashion and in series with a capacitance, said commutators each being operable with unidirectional current and bidirectional voltage and with controlled interruption and automatic ignition, each of said commutators including, respectively, a unidirectional current semiconductor device of the controlled commutation type having terminals corresponding to anode, cathode, and control, first adaptor circuit means having an input connected to the anode terminal of said semiconductor device and providing an output logic signal indicating when the anode-to-cathode voltage of said semiconductor device is less than a predetermined positive value close to zero, a logic gate having a first input connected to an output of said first adaptor circuit means to receive said logic signal, a second input which is a control signal input, and an output connected to an input of second adaptor circuit means which has an output connected to said control terminal of said semiconductor device, said logic gate outputting an interruption signal to said second adaptor circuit means when said first adaptor circuit means outputs said logic signal and an interruption signal is received at said control signal input of said logic gate, said second adaptor circuit means providing a control signal to said control terminal of said semiconductor device to trigger said semiconductor device absent an interruption signal output from said logic gate and providing a control signal to said control terminal of said semiconductor device to interrupt said semiconductor device in response to an interruption signal output from said logic gate.

7. A capacitive regulator in accordance with claim 6, characterized by the fact that it includes three of said branch circuits connected to one another in a three-phase configuration.

8. A capacitive regulator in accordance with claim 7, characterized by the fact that said branches are delta-connected.

* * * * *